United States Patent [19]

Tsuchiya et al.

[11] Patent Number: 5,268,769
[45] Date of Patent: Dec. 7, 1993

[54] IMAGE SIGNAL DECODING SYSTEM FOR DECODING MODIFIED HUFFMAN CODES AT HIGH SPEEDS

[75] Inventors: Tadashi Tsuchiya; Hiroo Fujisaki, both of Hadano; Tomoya Nishi, Sapporo; Hiromichi Murakami, Hadano, all of Japan

[73] Assignees: Hitachi, Ltd.; Hitachi Information Network Ltd.; Hitachi Computer Engineering Co., Ltd., Tokyo, Japan

[21] Appl. No.: 739,257

[22] Filed: Aug. 1, 1991

[30] Foreign Application Priority Data

Aug. 1, 1990 [JP] Japan .................................. 2-205809

[51] Int. Cl.⁵ .......................... H04N 1/41; H03M 7/40
[52] U.S. Cl. ..................... 358/427; 341/65; 341/67
[58] Field of Search ............... 358/427, 426; 382/43; 341/65, 67, 87, 95

[56] References Cited

U.S. PATENT DOCUMENTS 4,800,441  1/1989  Sato ..................................... 358/426
4,963,867  10/1990  Bertrand .............................. 341/67
5,173,695  12/1992  Sun et al. ........................... 341/67

Primary Examiner—Edward L. Coles, Sr.
Assistant Examiner—Scott A. Rogers
Attorney, Agent, or Firm—Antonelli, Terry, Stout & Kraus

[57] ABSTRACT

An image signal decoding system for decoding a variable length image data compressed by a modified Huffman code. The decoding object data is cut by a fixed length of 13 bits and the cut data is decoded by using a decode-encode circuit for decoding the input of the modified Huffman code with its end portion equalized and for encoding and generating the code length, the code kind and the run-length number on the basis of the decoded contents, and by using a rotator for shifting the bit data. For decoding a code which immediately follows, the data is shifted with the rotator by the bit number of the code length of the decoding output result, the end portion of the next decoding output result, the end portion of the next decoding object data is equalized with the input end portion of the encode-decode circuit, and it is placed after the immediately following decoding object data and is then input into the decode-encode circuit and decoded.

7 Claims, 6 Drawing Sheets

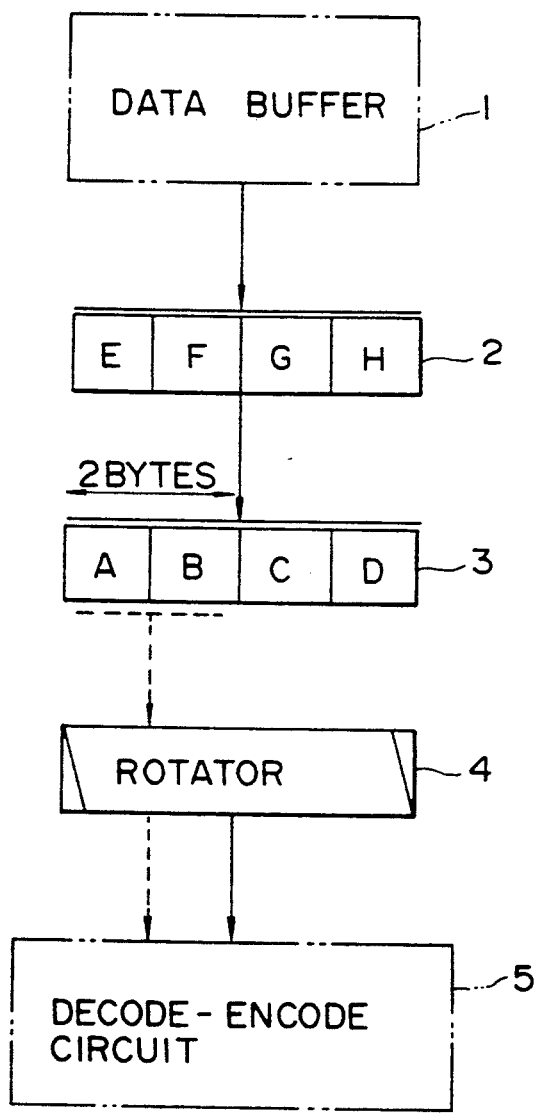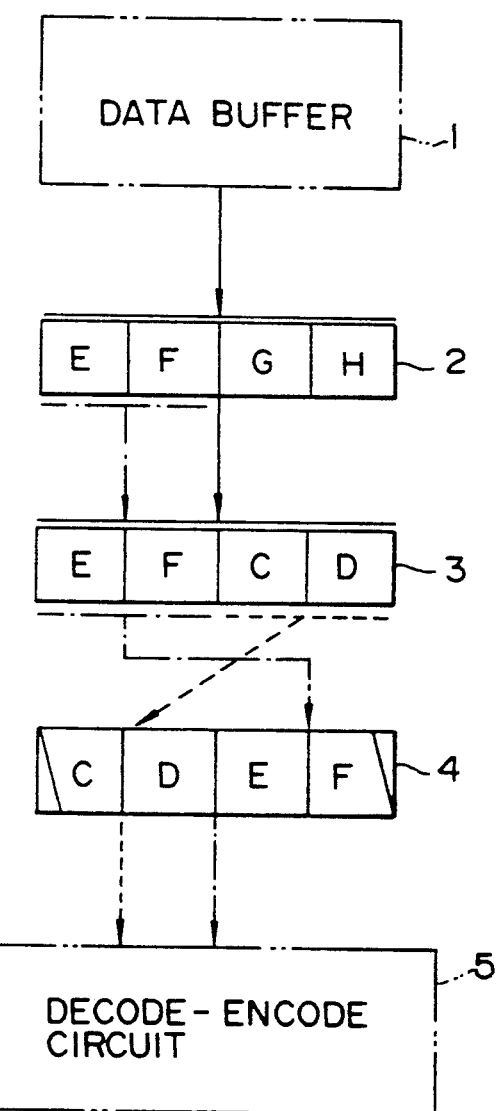

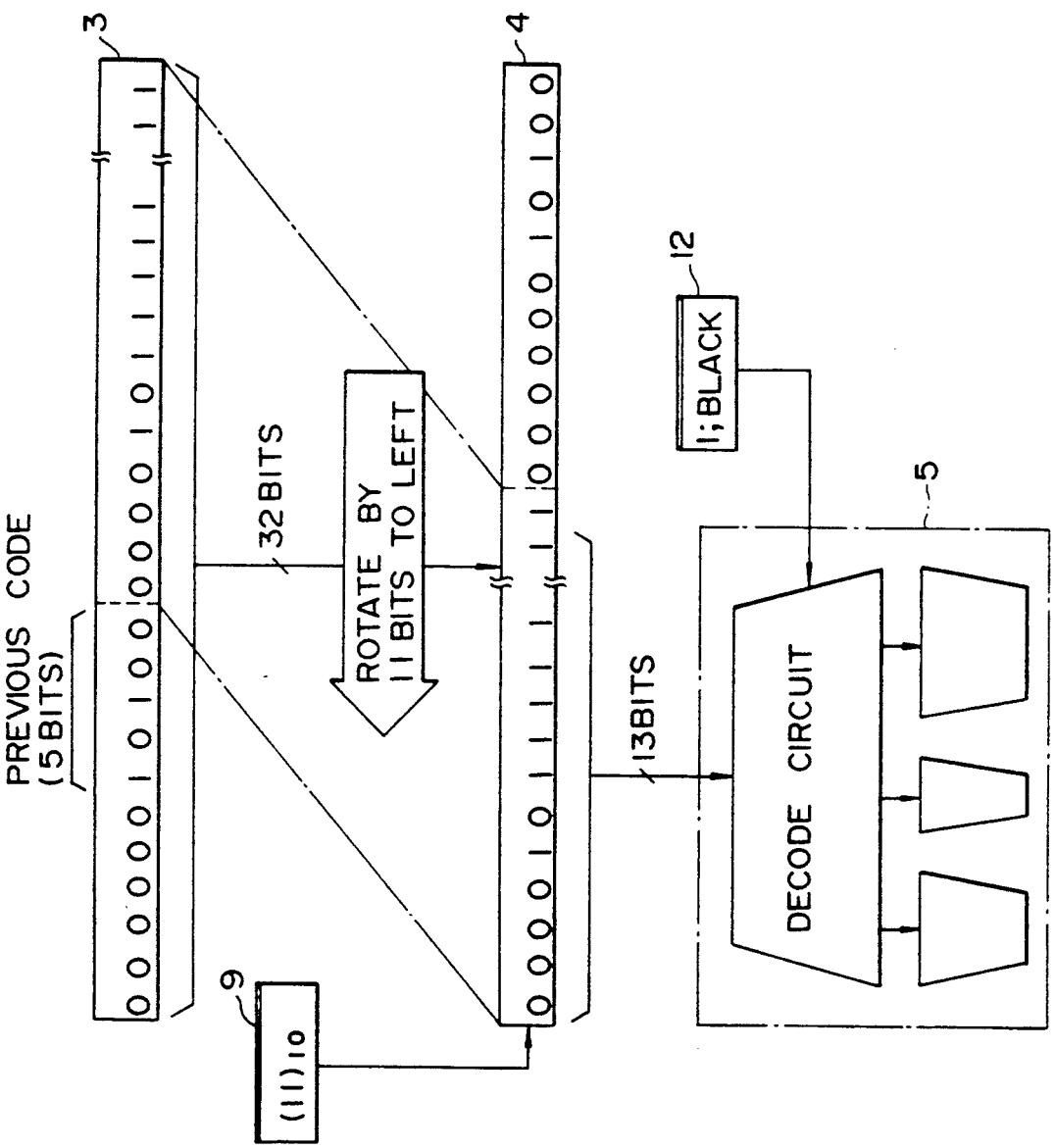

IMAGE SIGNAL DECODING SYSTEM FOR DECODING MODIFIED HUFFMAN CODES AT HIGH SPEEDS

BACKGROUND OF THE INVENTION

The present invention relates to an image signal decoding system and, more particularly, to an image signal decoding system capable of decoding modified Huffman codes at a high speed.

Heretofore, run-length codes have been employed as image-compressing codes for use with high-speed facsimile machines. As a run-length coding scheme, the Comite Consultatif Internationale Telegraphique et Telegraph (CCITT) recommends a modified Huffman coding scheme. The modified Huffman coding scheme is a coding scheme for code-compressing image signals such as a code that has encoded an arbitrary run-length number by combining 54 kinds of make-up codes which encodes up to 1728 pixels by every 64 pixels with 128 kinds of terminating codes in which every 64 pixels from pixel 0 to pixel 63 by one pixel, so as to allow the run-length number to correspond white run-length number and black run-length number to white pixels and black pixels, respectively.

Such a system for decoding image signals encoded by the modified Huffman coding scheme of this type is known, for example, by an image signal decoding system as disclosed in Japanese Patent Publication (Kokoku) No. 16,071/1989. The image signal decoding system as disclosed in this prior patent publication is arranged to perform the decoding of white or black run-length information of facsimile data encoded by the modified Huffman coding scheme by a small fixed memory capacity. In this system, the kind and run length of codes are prepared so as to correspond to each of the modified Huffman codes (hereinafter referred to as "MH codes"), and the MH codes are decoded by providing data of 10 bits obtained by processing the received MH codes as a ROM (read only memory) access address, reading the data in the ROM and developing it into dots.

However, the image signal decoding system in the prior art technology presents the problem that no attention is paid to the processing speed for decoding, so that the demand for processing image signals at a high speed is not met.

SUMMARY OF THE INVENTION

Therefore, the present invention has the object to provide an image signal decoding system for performing the decoding of the MH codes at a high speed.

In order to achieve the aforesaid object, the present invention consists of an image signal decoding system adapted to decode an image data of a variable length whose data is compressed by MH code, comprising a decode-encode circuit for decoding input of a modified Huffman code with its end portion equalized, encoding a code length, a code kind and a run length by decoded content and generating them; and a rotator for shifting a bit data; wherein decoding object data is cut by a fixed length of 13 bits, the cut data is inputted into and decoded by the decode-encode circuit through the rotator, the data is shifted by a bit number of a code length as the output result of decoding so as to equalize an end portion of the decoding object data which comes next with an input end portion of an encode-decode circuit, and a decoding object data cut next is continuously input into the decode-encode circuit and decoded.

From the top of the MH code data as the decoding object data, 13 bits of the maximum code length of the MH code are cut, and the 13 bits are supplied to the decode-encode circuit as an input data for decoding after their end portions are equalized by the rotator. At the concurrent time, a color-designating data indicative of the white run length or the black run length is supplied to the decode-encode circuit. The decode-encode circuit decodes and determines the code by its decoder and decodes for forming each data of the code length, the code kind and the run length of the MH code by its encoder. And, for decoding the next code, the cut data is shifted by the rotator by the bit number of the code length as the decoding output result to thereby equalize the end portion of the next decoding object data with the input end portion of the encode-decode circuit. Further, the rest is supplied to the decode-encode circuit, followed by the next cut decoding object data, for decoding the next MH code.

As described hereinabove, the image signals of the decoding object data whose data is compressed by the MH code of a variable length are decoded in order.

In this case, the input data is shifted by the rotator and input in such a manner that the end portion of the input data is caused to agree with the input end portion of the decode-encode circuit. The data supplied to the rotator is temporarily stored in the buffer register having a plurality of data regions, and an empty data region supplied to the rotator from the buffer register is supplemented with a next decoding object data from the read register.

In order to perform the data transfer among the rotator, the buffer register and the read register, there are provided a first transfer processing means for transferring data from the buffer register to a data storage region in which decoded data of the rotator is stored and a second transfer processing means for transferring data from the read register to a region for transmitted data of the buffer register. These means allow the data transfer between the registers. The processing by the first and second transfer processing means can be performed concurrently with and parallel to each other, thereby shortening the period of time for decoding the MH code data.

As described hereinabove, the decode-encode circuit is designed to perform a logic operation of a hard logic, unlike the processing by making access to a memory such as reading ROM data, etc., so that the decoding processing can be performed at a high speed.

BRIEF DESCRIPTION OF THE DRAWINGS

FIGS. 2a, 2b, 3a and 3b are diagrams showing the control over transferring data among the data buffer, the read register, the buffer register and the rotator.

FIGS. 4, 5 and 6 are diagrams showing a flow of data for decoding codes from the buffer register to the code-length register, the code kind register and the run-length register.

DESCRIPTION OF THE PREFERRED EMBODIMENTS

Figure 1:
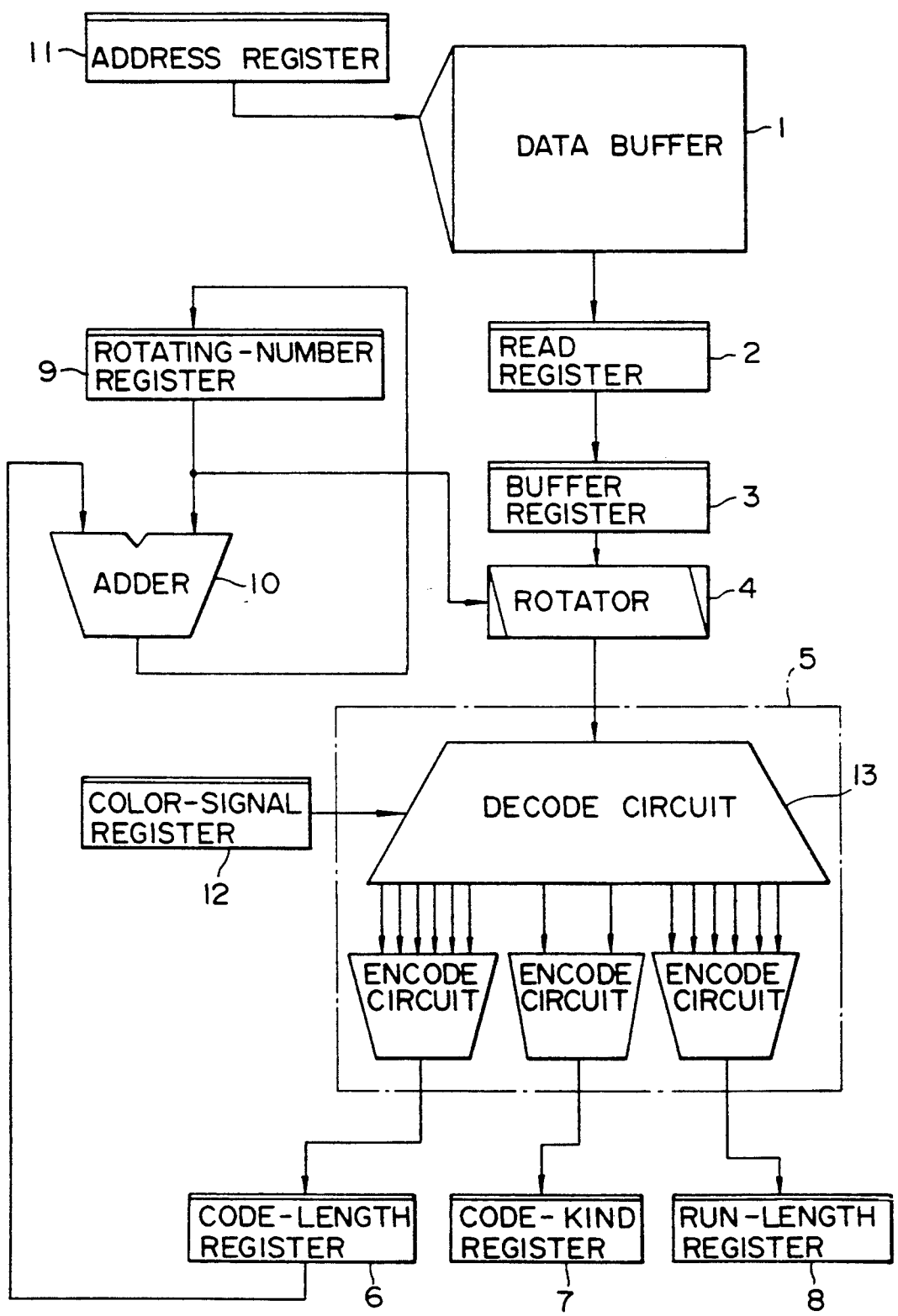
FIG. 1 is a block diagram showing the circuit configuration of an essential portion of an image signal decoding processor for decoding an image signal according to an embodiment of the present invention.

FIG. 1 is a block diagram showing the circuit configuration of an essential portion of an image signal decoding processor for decoding image signals according to an embodiment of the present invention. In FIG. 1, reference numeral 1 stands for a data buffer, reference numeral 2 for a read register, reference numeral 3 for a buffer register, reference numeral 4 for a rotator, reference numeral 5 for a decode-encode circuit, reference numeral 6 for a code-length register, reference numeral 7 for a code-kind register, reference numeral 8 for a run-length register, reference numeral 9 for a rotating-number register, reference numeral 10 for an adder, reference numeral 11 for an address register for the data buffer 1, and reference numeral 12 for a color-signal designating register.

The block diagram of FIG. 1 indicates the circuit configuration for decoding MH (modified Huffman) code data. All of the MH code data to be decoded is stored in the data buffer The address register 11 stores an address for designating read data of the data buffer 1. The data read out from the data buffer 1 is stored in the read register 2 and then transmitted to and temporarily stored in the data buffer register 3. The data transmitted to the buffer register 3 is further transmitted to the rotator 4 which shifts the bits of the data by the bit number in accordance with the code length, thereby equalizing the end portion of the input data and supplying it into the decode-encode circuit 5. The decode-encode circuit 5 decodes the codes of the input data and encodes each of them in accordance with the decoded contents, thereby generating each data of the code length, the code kind and the run length of the results obtained by decoding the MH codes. Each of the data of the code length, code kind and run length is stored in the code-length register 6, the code-kind register 7, and the run-length register 8, respectively.

The code-length data obtained by decoding and stored in the code-length register 6 is generated to the adder 10 to which the data from the rotating-number register 9 is added and which adds the contents of the rotating-number register 9 to the code-length data of the code-length register 6, thereby using the resulting data as a rotating number for the code to be decoded next. The resulting data is stored again in the rotating-number register 9. On the other hand, the data of the rotating-number register 9 is supplied to the rotator 4 to thereby shift the data of the buffer register 3, thereby determining a shift quantity upon inputting into the decode-encode circuit 5. The color-designating data of a white run length or a black run length, stored in the color-designating register 12 is supplied to the decode-encode circuit 5 and the color designation of the code to be decoded is shifted to each other, thereby allowing the decode-encode circuit 5 to decode the white run-length number or the black run-length number.

Description will specifically be made of the processing for decoding the MH codes by using the image signal decoding processor having the aforesaid structure.

First, as initial setting, all of the MH codes to be decoded are stored in the data buffer 1. Each of the address register 11, the read register 2, the buffer register 3, the rotating-number register 9 and the color-signal designating register 12 is set to "0". The "0" designated by the color-signal designating register 12 means that the MH code as a decoding object is initially a white run length. On the other hand, the color-signal designating register 12 is initially set to "1" in order to allow the decoding processing to start with a black run length.

In starting the decoding processing, first, the address register 11 reads MH code data of 4 bytes from the data buffer 1 and sets it in the read register 2. In this case, no MH code data is set in the buffer register 3, so that the contents of the read register 2 are transmitted to the buffer register 3. Then, +4 is added to the contents of the address register 11 and 4 bytes of the MH code data are read again from the data buffer 1 to thereby set it to the read register 2. Thereafter, the MH code data stored in the buffer register 3 is transmitted to the rotator 4 which in turn rotates the MH code data to the left on the basis of the value of the rotating-number register 9. As a result, the MH code as the decoding object is set to the left end, thereby inputting 13 bits (the maximum code length of the MH code) from the left end of the MH code data stored temporarily in the rotator 4 into the decode-encode circuit 5.

The decode-encode circuit 5 selects an active decoder of the decode circuit on the basis of 13 bits of the input MH code data and the color signal of the color-signal designating register 12 designating the white run length or the black run length, thereby decoding the MH code data. Further, the code length, code kind and run length of the decoded MH code are generated by the encode circuit on the basis of the contents of the output of the decoder and output to the code-length register 6, the code-kind register 7, and the run-length register 8, respectively. A decision is then made on the basis of the contents of the code kind of the MH code output from the decode-encode circuit 5 to determine if the decoded MH code is a terminating code or a make-up code. If the decoded MH code is the terminating code, on the one hand, the color signal of the color-signal designating register 12 is inverted for decoding a code coming next. If the decoded MH code is the make-up code, on the other hand, the color signal is left as it is.

Then, in order to update the value of the rotating-number register 9, the values of of the code-length register 6 and the rotating-number register 9 are input into the adder 10, and the addition is performed by the adder 10 on the basis of the input data supplied to the adder 10. The addition results are stored again in the rotating-number register 9.

When the next code is to be decoded, like when the previous code has been decoded, the MH code data set to the buffer register 3 is transmitted to the rotator 4 and the MH code data within the rotator 4 is rotated to the left only by the rotating number stored in the rotating-number register 9, thereby inputting 13 bits from the left end of the rotated results and the color signal of the color-signal designating register 12 in the decode-encode circuit 5. As a consequence, the code length, the code kind and the run length of the currently decoded MH code are generated and stored again in the code-length register 6, the code-kind register 7 and the run-length register 8, respectively. Further, the contents of the rotating-number register 9 are updated by the contents of the code-length register 6, and the color signal data of the color-signal designating register 9 is set again by the contents of the code-kind register 7. The decoding processing of the MH code which follows is performed in the same manner as described hereinabove.

FIGS. 2a, 2b, 3a and 3b are diagrams for describing the way of controlling the transfer of data among the data buffer 1, the read register 2, the buffer register 3 and the rotator 4.

It is noted herein that each of the read register 2 and the buffer register 3 is a register of a 4-byte width and that data of 4 bytes is transferred between the data buffer 1 and the read register 2, while data of 2 bytes or 4 bytes is transferred between the read register 2 and the buffer register 3.

Referring to FIG. 2a, the MH code data "AB" constituting upper 2 bytes of the buffer register 3 is input into the decode-encode circuit 5 through the rotator 4. When all have been decoded, the MH code data "AB" located at upper 2 bytes of the buffer register 3 is made unnecessary. At this time, the contents of the rotating-number register 9 are updated and the rotating number (the shift number) exceeds 15.

As the updating results of the rotating-number register 9 has exceeded 15, the MH code data "EF" constituting upper 2 bytes of the read register 2 is transmitted to upper 2 bytes of the buffer register 3, as shown in FIG. 2b. Thereafter, the MH code data "CD" constituting lower 2 bytes of the buffer register 3 is input into the decode-encode circuit 5 and shifted by the rotator for decoding, thereby equalizing its end portion. At this time, the MH code data "EF" transmitted to the upper 2 bytes of the buffer register 3 for decoding next is located after the previous MH code data "CD" by shifting by the rotator 4.

Figure 3A:
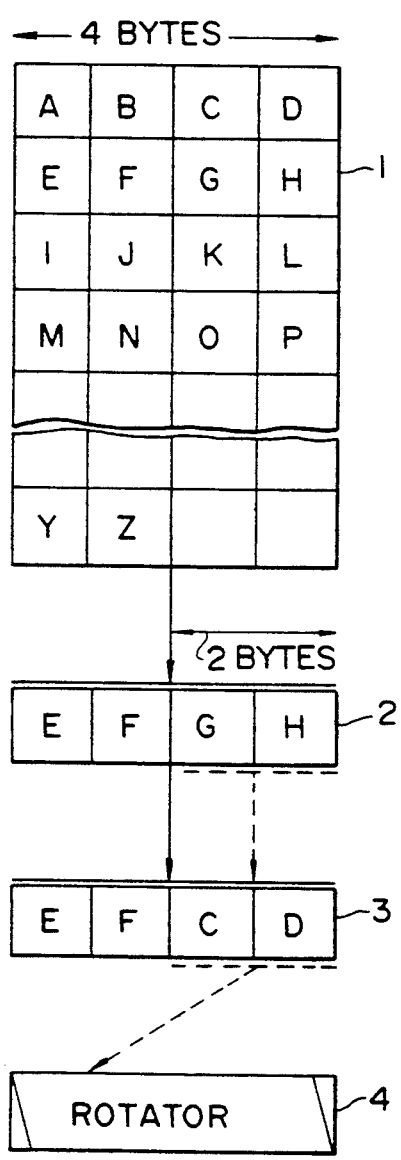

As all the MH code data "CD" constituting the lower 2 bytes of the buffer register 3 has been decoded, i.e. when the updating results of the rotating-number register 9 have exceeded 31, the MH code data "GH" constituting lower 2 bytes of the read register 2 is transmitted to lower 2 bytes of the buffer register 3 as shown in FIG. 3a. It is noted herein that, as the effective bit number of the rotating-number register 9 is represented by 5 bits in order to comply with a physical shift quantity of the rotator 4, the range represented thereby is from 0 to 31, and it is represented again by 0, 1, 2, after it has exceeded 31.

Figure 3B:
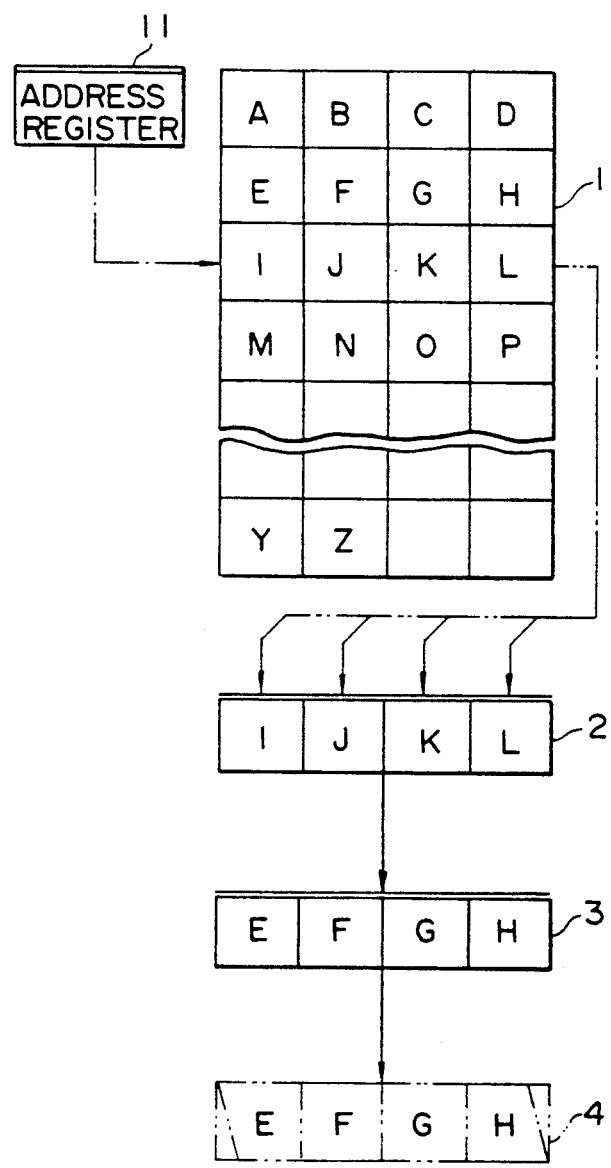

After the MH code data "GH" constituting the lower 2 bytes of the read register 2 has been transmitted to the lower 2 bytes of the buffer register 3, all the MH code data "EFGH" stored in the read register 2 has been transmitted to the buffer register 3. Thereafter, as shown in FIG. 3b, MH code data "IJKL" is read out from the data buffer 1 into the read register 2 for decoding next by reading the MH code data of 4 bytes from the data buffer 1 by the address of the data buffer 1 designated by the address register 11 and setting it to the read register 2. And +4 is added to the contents of the address register 11 for designating next MH code data.

It is to be noted herein that the processing for first data transfer between the rotator 4 and the buffer register 2 and the processing for second data transfer between the buffer register 2 and the read register 2 can be performed separately and independently from each other, so that both of the processing can be performed concurrently with and parallel to each other.

A flow of data from the buffer register 3 to the code-length register 6, the code-kind register 7 and the run-length register 8 will be described more in detail with reference to FIGS. 4, 5 and 6.

Description will be made of the processing for decoding a MH code (10100) indicative of a white run length of 9 bits as an example.

Figure 4:
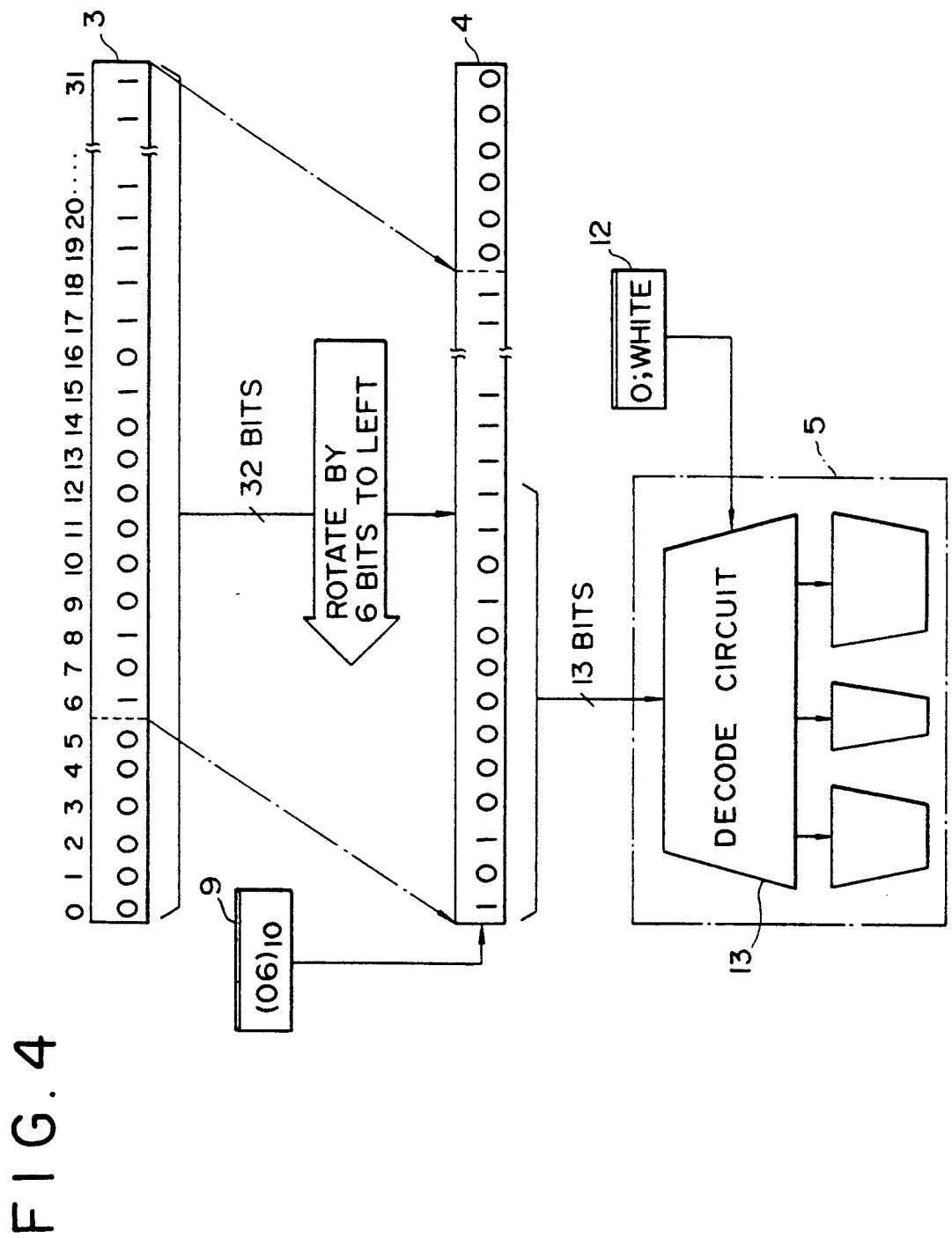

As shown in FIG. 4, the MH code data indicative of the white run length of 9 bits as the decoding object exists at the 6th bit of the buffer register 3 and thereafter. The code $(10100)_2$ of the MH code data existing in the buffer register 3 is transmitted to the rotator 4 and rotated to the left in accordance with the contents of the rotating-number register 9. At this time, the rotating-number register 9 is set to $(06)_{10}$ in order to place the MH code located at the 6th bit of the rotator 4 and thereafter to the left end side, thereby rotating (shifting) to the left by 6 bits by the rotator 4. By rotating the data to the left by 6 bits, data $(1010000001011)_2$ of 13 bits from the left end of the rotator 4 and data of the color-signal register 12 are input into the decode circuit 13 of the decode-encode circuit 5. At this time, as color designating data, $(0)_2$, indicative of white, is initially set to the color-signal register 12, thereby allowing the decode circuit 13 of the decode-encode circuit 5 to decode the code $(10100)_2$ of the MH code indicative of the white run length of 9 bits.

Figure 5:
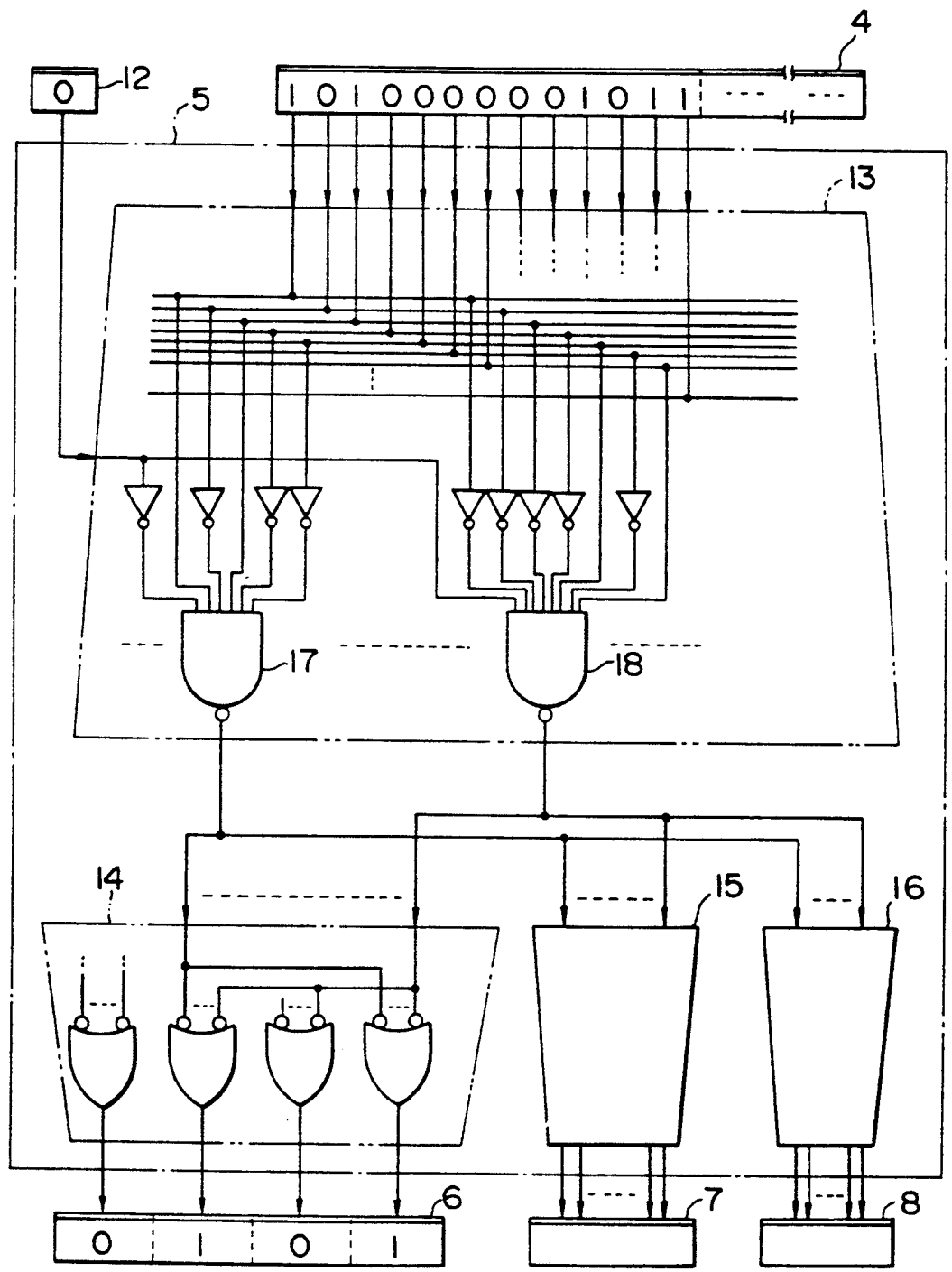

Description will then be made of a flow of data after input into the decode circuit 13 with reference to FIG. 5. The code data of 13 bits located to the left end from the rotator 4 is input into the decode circuit 13 of the decode-encode circuit 5. The code data is input into all of NAND circuits so prepared as to make a logical decision in a one-to-one correspondence to each MH code. The number of pins for input signal lines of each NAND circuit is so arranged as to agree with a total of one pin for the color signal and the number of pins for the input signal lines for the code length of the corresponding MH code. Hence, the MH code is decoded by the NAND circuit corresponding to each of the codes and having input terminals in agreement with the code length plus one. In this example, there are shown a NAND circuit 17 for the MH code indicative of the white run length of 9 dots and a NAND circuit 18 for the MH code indicative of the black run length of 11 dots. The code length of the MH code indicative of the white run length of 9 dots is 5 bits, so that the NAND circuit 17 has a total of six input terminals consisting of one for the color signal and five for the MH code. Further, a plurality of NOT circuits are provided immediately prior to the NAND circuit 17 so as to generate output $(1)_2$, only when the MH code corresponding to the NAND circuit 17 is input.

In other words, the NAND circuit 17 generates output $(1)_2$ only when the color-designating code $(0)_2$ and code $(10100)_2$ of the MH code are indicative of the white run length of 9 dots, while it otherwise generates output $(0)_2$. And the NAND circuit 18 generates output $(1)_2$ only when the color-designating code $(1)_2$ and code $(0000101)_2$ of the MH code are indicative of the black run length of 11 dots, while it otherwise generates output $(0)_2$. The data generated from each of the NAND circuits 17, 18, ... is input into an encode circuit 14 for the code length, an encode circuit 15 for the code kind, and an encode circuit 16 for the run length.

The encode circuit 14 for the code length is provided with four NOR circuits so as to represent "13 bits" of the maximum code length of the MH code in a binary unit, and the output of the NOR circuits corresponds to each bit of the code-length register 6. The input of either one of the NOR circuits is $(1)_2$ and the output thereof is $(1)_2$, while the output of the remaining NOR circuits is $(0)_2$. Hence, in the case of the MH code indicative of the white run length of 9 dots, the data indicative of its code length (5 bits; 0101) is obtained by each output $(0)_2$, $(1)_2$, $(0)_2$ and $(1)_2$ of the respective four NOR circuits and output to the code-length register 6. Hence, for instance, the output from the NAND circuit for the white run length of 9 dots is input into the second and fourth NOR circuits from the left of the four NOR circuits. As a result, the output of each NOR circuit is input into the bit corresponding to the code-length register 6, and the code length (5 bits) is given to the code-length register 6.

Further, the encode circuit 15 for the code kind and the encode circuit 16 for the run length are given data of the code kind and the run length, respectively, by using a plurality of NOR circuits in a similar logic as described hereinabove.

Thereafter, the bit data of the code length given to the code-length register 6 is added to the rotating number stored in the rotating-number register 9, and it is updated as a rotating number for decoding the code coming next and set to the rotating-number register 9. Then, when the code kind is a terminating code (its run length is a code of from 0 dot to 63 dots), it is determined that it is the terminating code and the color signal is reversed to white or black.

For instance, when the decoded code is the MH code indicative of the white run length of 9 dots, the data of the code length $(05)_{10}$ is added to the data of the rotating number $(06)_{10}$ held previously by the rotating-number register 9, and the resulting data $(11)_{10}$ is employed as a rotating number for decoding the code which follows next.

When the code which follows next is decoded, the color signal is reversed to $(1)_2$ indicative of black. As a result, the data is brought into the state as shown in FIG. 6 and the decoding of the MH code indicative of the white run length of 9 dots is finished and the preparation for decoding the next code is finished, too.

As shown in FIG. 6, this arrangement allows the code data to be rotated to the left by 11 bits and placed to the left end, and the decoding is performed by inputting data $(0000101111111)_2$ of 13 bits into the decode-encode circuit 5. The next code is a black run-length code of 11 dots $(0000101)_2$. Thereafter, a series of these processes is repeated to continuously decode the MH codes.

As described hereinabove, the image signal decoding system according to this embodiment allows the MH code data to be decoded by the logic operation of a hardware logic without making access to a ROM and enables the MH code data stored in the data buffer 1 to be read out and set to read register 2 as well as parallel processing for decoding the MH code data. This provides the effect of improving the decoding processing.

The embodiment as described hereinabove may be summarized as follows.

1. In order to continuously decode MH codes in the data buffer 1 storing the MH code data as the decoding object data, there are provided the read register 2 for reading out the MH code data from the data buffer 1 and the buffer register 3 for storing the MH code data as the decoding object data, and the increasing number of decoded MH code data portions is supplemented with the MH code data in the read register 2 in order as the decoding of the MH code data in the buffer register 3 proceeds.

2. The decode-encode circuit 5 comprises a white run-length decode-encode circuit section and a black run-length decode-encode circuit section. The color-signal data indicative of the white run-length code or the black run-length code determines if the data is decoded or encoded by either of the two decode-encode circuit sections.

3. Into the decode-encode circuit 5 is inputted the MH code having the maximum code length of 13 bits to the left end. The input MH code data of 13 bits is decoded into the code length, the code kind and the run length of the decoded MH code by the decode-encode circuit 5 and they are output to each of the respective registers. Details of the kind of the codes are such that the color of the run of the code is white or black, the code is a terminating code or a make-up code, or the code is a end-of-line code (EOL) or a non-defined code.

4. The MH code data in the buffer register 3 is rotated by the rotator 4 and 13 bits are cut out from the top and input into the decode-encode circuit 5. When the MH code data in the buffer register 3 is quantitatively decoded, a constant quantity of the MH code data in the read register 2 is supplemented. Thereafter, this Processing is repeated.

5. When all the MH code data in the read register 2 is supplemented in the buffer register 3, the MH code data is read out from the data buffer 1 storing all the MH code data and stored in the read register 2. As the control over the decoding of the MH code data is carried out in the manner as described hereinabove, the control over the decode-encode circuit 5 and the MH code data is free of operational error.

As described hereinabove, the image signal decoding system according to the present invention permits the decoding processing and the parallel processing of making access to a memory by controlling the data transfer by using the read register 2 and the buffer register 3, thereby avoiding the adverse influence of the memory access upon the decoding processing. In order to perform the decoding by the decode-encode circuit 5, a ROM is prepared for decoding information so that the period of time for decoding can be shortened to approximately 75% as compared with the conventional processing in which the data in the ROM is read out for each code.

Many different embodiments of the present invention may be constructed without departing from the spirit and scope of the invention. It should be understood that the present invention is not limited to the specific embodiments described in this specification. To the contrary, the present invention is intended to cover various modifications and equivalent arrangements included within the spirit and scope of the claims.

What is claimed is:

1. An image signal decoding system for decoding variable-length image data compressed by a modified Huffman code, said image signal decoding system comprising:

a decode-encode circuit having a white run-length decode-encode circuit section and a black run-length decode-encode circuit section, and either of the white run-length decode-encode circuit section or the black run-length decode-encode circuit section determines to decode or encode on the basis of color signal data indicative of a white run-length code or a black run-length code, to decode the modified Huffman code with its end portion equalized, by the determined decode-encode circuit, to encode a code length, a code kind and a run-length number on the basis of decoded contents, and to generate the same; and a rotator for shifting bit data, wherein decoding object data is cut by a fixed length of 13 bits, the cut data is input into and decoded by the decode-encode circuit through the rotator, the data is shifted by a bit number of a code length as the output result of decoding so as to equalize an end portion of the decoding object data which comes next with an input end portion of an encode-decode circuit, and the decoding object data cut next is continuously input into the decode-encode circuit and decoded.

2. An image signal decoding system for decoding variable-length image data compressed by a modified Huffman code, said image signal decoding system comprising:

a decode-encode circuit for decoding the modified Huffman code with its end portion equalized, for encoding a code length, a code kind and a run-length number on the basis of decoded contents, and for generating the same;

a rotator for shifting bit data;

a register for storing bit-shift control data to be supplied to the rotator;

an adder for adding code-length data of a code length of a decoded output result, wherein decoding object data being cut by a 13-bit fixed length, the cut decoding object data being input through the rotator into said decode-encode circuit and being decoded, the bit-shift control data being computed by adding the decoded code-length data in order and adding 13 bits as the modulest, the rotator being controlled with the bit-shift control data and an end portion of a next decoding object data being equalized with an input end portion of an encode-decode circuit by shifting the decoded output result by a bit number of the code length of the decoded output result, and the decoding object data that is cut next being continuously entered into the decode-encode circuit and being decoded.

3. An image signal decoding processor for decoding variable-length image data, said image signal decoding processor comprising:

a decode-encode circuit for decoding input of modified Huffman code with its end portion equalized and for encoding and for generating a code length, a code kind and a run-length number on the basis of decoded contents;

a rotator for shifting bit data input into the decode-encode circuit;

a buffer register having a plurality of data regions in which data to be supplied to the rotator is temporarily stored;

a read register for supplementing a next decoding object data to an empty data region from which the data has been supplied to the rotator from the buffer register;

firs transfer processing means for transferring the data from the buffer register to a region of the rotator where the decoding has been performed, and second transfer processing mans for transferring the data from the read register to a data region in which the data of the buffer register has been transferred.

4. An image signal decoding processor as claimed in claim 3, wherein the first transfer processing means is performed parallel to the second transfer processing means.

5. An image signal decoding system for decoding variable-length image data compressed by a modified Huffman code, said image signal decoding system comprising:

a data buffer for storing the variable-length image data compressed by the modified Huffman code;

a read register for reading the modified Huffman code data from the data buffer;

a buffer register for storing the modified Huffman code data serving as a processing object for coding, wherein decoding object data is cut by a 13-bit fixed length;

a rotator for shifting bit data; and a decode-encode circuit for decoding the modified Huffman code with its end portion equalized, for encoding a code length, a code kind and a run-length number by decoded content and for generating the same, wherein the decoding object data is shifted by a bit number of a code length of a decoded output result to equalize an end portion of the immediately following decoding object data with an input end portion of the encode-decode circuit, the immediately following decoding object data being continuously input into the decode-encode circuit and being decoded, the modified Huffman code in the read register being supplemented one after another to a portion of the buffer register, in which an increasing number of the decoded modified Huffman code data has been stored, as the decoding of the modified Huffman code data in the buffer register precedes, and the modified Huffman code and the data buffer, in which the modified Huffman code of the decoding object data is stored, is continuously decoded.

6. An image signal decoding processor as claimed in claim 5, wherein the decoding circuit has a number of input signal pins of the NAND gates, corresponding to a sum of a number of digits of the corresponding modified Huffman code and one pin for a color signal.

7. An image signal decoding processor for decoding a decoding object data to be represented by a modified Huffman code, said image signal decoding processor comprising:

a data buffer for temporarily storing the decoding object data;

a rotator for sequentially bit-shifting the decoding object data by a bit number of a code length decoded by previous decoding processing to hold the decoding object data generated rom the data buffer and to transmit a given length of data from a top portion of the held decoding object data;

a decoding circuit for generating decoding data in response to the decoding object data of the given length generated from the rotator, the decoding circuit comprising a group of NAND gates corresponding on a one-to-one basis with the modified Huffman code; and an encoding circuit for encoding and generating encoding data indicative of a code-length, a code kind and a run-length in response to the decoding data, the encoding circuit comprising a code-length encoding section, a code kind encoding section, and a run-length encoding section, each encoding section including a group of NOR gates.

8. An image signal decoding system for decoding variable-length image data compressed by a modified Huffman code, said image signal decoding system comprising:
- a decode-encode circuit for decoding the modified Huffman code with its end portion equalized, for encoding a code length, a code kind and a run-length number on the basis of decoded contents, and for generating the same;
- a rotator for shifting bit data;
- a register for storing bit-shift control data to be supplied to the rotator;
- a adder for adding code-length data of a code length of a decoded output result, wherein decoding object data being cut by a 13-bit fixed length, the cut decoding object data being input through the rotator into said decode-encode circuit and being decoded, the bit-shift control data being computed by adding the decoded code-length data in order and adding 13 bits as the [modulest] *modulus*, the rotator being controlled with the bit-shift control data and an end portion of a next decoding object data being equalized with an input end portion of an encode-decode circuit by shifting the decoded output result by a bit number of the code length of the decoded output result, and the decoding object data that is cut next being continuously entered into the decode-encode circuit and being decoded.

* * * * *